(12) United States Patent
Nguyen et al.

(10) Patent No.: US 9,219,150 B1
(45) Date of Patent: Dec. 22, 2015

(54) METHOD FOR FABRICATING SEMICONDUCTOR STRUCTURES INCLUDING FIN STRUCTURES WITH DIFFERENT STRAIN STATES, AND RELATED SEMICONDUCTOR STRUCTURES

(71) Applicant: Soitec, Crolles (FR)

(72) Inventors: Bich-Yen Nguyen, Austin, TX (US); Mariam Sadaka, Austin, TX (US); Christophe Maleville, Laterasse (FR)

(73) Assignee: SOITEC, Bernin (FR)

( * ) Notice: Subject to any disclaimer, the term of this patent is extended or adjusted under 35 U.S.C. 154(b) by 0 days.

(21) Appl. No.: 14/489,817

(22) Filed: Sep. 18, 2014

(51) Int. Cl.
*H01L 23/52* (2006.01)
*H01L 21/8238* (2006.01)
*H01L 21/30* (2006.01)
*H01L 21/00* (2006.01)
*H01L 29/78* (2006.01)
*H01L 29/66* (2006.01)
*H01L 29/06* (2006.01)
*H01L 29/165* (2006.01)
*H01L 21/306* (2006.01)
(Continued)

(52) U.S. Cl.
CPC ............ *H01L 29/7842* (2013.01); *H01L 21/22* (2013.01); *H01L 21/26506* (2013.01); *H01L 21/30604* (2013.01); *H01L 21/823412* (2013.01); *H01L 21/823431* (2013.01); *H01L 21/823481* (2013.01); *H01L 27/0886* (2013.01); *H01L 29/0649* (2013.01); *H01L 29/165* (2013.01); *H01L 29/66795* (2013.01); *H01L 29/785* (2013.01)

(58) Field of Classification Search
CPC ............ H01L 21/324; H01L 21/76254; H01L 21/76259; H01L 2221/68363
USPC .......... 257/211, E27.099, 209, 296, 351, 616; 438/480, 458, 665, 154, 199, 299, 479
See application file for complete search history.

(56) References Cited

U.S. PATENT DOCUMENTS 6,303,468 B1    10/2001    Aspar et al.
6,335,258 B1    1/2002    Aspar et al.
(Continued)

OTHER PUBLICATIONS

Castro et al., Selective and Anisotropic Dry Etching of Ge over Si, Journal of Integrated Circuits and Systems 2013, vol. 8, No. 2, pp. 104-109.
(Continued)

*Primary Examiner* — Long K Tran
*Assistant Examiner* — Dzung Tran
(74) *Attorney, Agent, or Firm* — TraskBritt (57) ABSTRACT

Methods of forming a semiconductor structure include providing a multi-layer substrate having an epitaxial base layer overlying a strained primary semiconductor layer above a buried oxide layer. Elements within the epitaxial base layer are used to alter a strain state in the primary semiconductor layer within a first region of the multi-layer substrate without altering a strain state in the primary semiconductor layer within a second region of the multi-layer substrate. A first plurality of transistor channel structures are formed that each comprise a portion of the primary semiconductor layer within the first region of the multi-layer substrate, and a second plurality of transistor channel structures are formed that each comprise a portion of the primary semiconductor layer within the second region of the multi-layer substrate. Semiconductor structures fabricated by such methods may include transistor channel structures having differing strain states.

18 Claims, 4 Drawing Sheets

(51) Int. Cl.
  *H01L 21/265* (2006.01)
  *H01L 21/22* (2006.01)
  *H01L 27/088* (2006.01)
  *H01L 21/8234* (2006.01)

(56) References Cited

U.S. PATENT DOCUMENTS

| | | |
|---|---|---|
| 6,756,286 B1 | 6/2004 | Moriceau et al. |
| 6,809,044 B1 | 10/2004 | Aspar et al. |
| 6,946,365 B2 | 9/2005 | Aspar et al. |
| 6,963,078 B2 | 11/2005 | Chu |
| 6,991,972 B2 | 1/2006 | Lochtefeld et al. |
| RE39,484 E | 2/2007 | Bruel |
| 7,282,402 B2 | 10/2007 | Sadaka et al. |
| 7,335,545 B2 | 2/2008 | Currie |
| 7,524,740 B1 | 4/2009 | Liu et al. |
| 7,981,767 B2 | 7/2011 | Guenard et al. |
| 8,169,025 B2 | 5/2012 | Bedell et al. |
| 2002/0011617 A1* | 1/2002 | Kubo et al. .......... 257/301 |
| 2003/0077885 A1* | 4/2003 | Aspar et al. .......... 438/517 |
| 2004/0195656 A1 | 10/2004 | Ghyselen et al. |
| 2006/0113603 A1 | 6/2006 | Currie |
| 2009/0001479 A1 | 1/2009 | Wiatr et al. |
| 2009/0229743 A1* | 9/2009 | Faure et al. .......... 156/247 |
| 2009/0290610 A1* | 11/2009 | Eichler et al. .......... 372/44.01 |
| 2011/0156212 A1* | 6/2011 | Arena .......... 257/615 |
| 2014/0008730 A1 | 1/2014 | Mitard et al. |

OTHER PUBLICATIONS

Kuhn et al., Past, Present and Future: SiGe and CMOS Transistor Sealing, ECS Trans., Bol. 33, No. 6, (2010), pp. 3-17.

Thean et al., Performance of Super-Critical Strained-Si Directly on Insulator (SC-SSOI) CMOS Based on High-Performance PD-SOI Technology, 2005 Symp-0osium on VLSI Technology Digest of Technical Papers, Jun. 14-16, 2005, pp. 134-135.

Thean et al., Uniaxial-Biaxial Stress Hybridization for Super-Critical Strained-Si Directly on Insulator (SC-SSOI) PMOS with Different Channel Orientations, Electron Devices Meeting, 2005. IEDM Technical Digest. IEEE International, Dec. 5, 2005, pp. 509-512.

Uchida et al., Experimental Study of Biaxial and Uniaxial Strain Effects on Carrier Mobility in Bulk and UltrathinBody SOI MOSFETs, Electron Devices Meeting, 2004. IEDM Technical Digest. IEEE International, Dec. 13-15, 2004, pp. 229-232.

* cited by examiner

METHOD FOR FABRICATING SEMICONDUCTOR STRUCTURES INCLUDING FIN STRUCTURES WITH DIFFERENT STRAIN STATES, AND RELATED SEMICONDUCTOR STRUCTURES

TECHNICAL FIELD

Embodiments of the present disclosure relate to methods that may be used to fabricate n-type metal-oxide-semiconductor (NMOS) field effect transistors and p-type metal-oxide-semiconductor (PMOS) field effect transistors having different stress states in a common layer on a semiconductor substrate, and to semiconductor structures and devices fabricated using such methods.

BACKGROUND

Semiconductor devices such as microprocessors and memory devices employ solid state transistors as a basic, primary operational structure of the integrated circuits thereof. One type of transistor commonly employed in semiconductor structures and devices is the field effect transistor (FET), which generally includes a source contact, a drain contact, and one or more gate contacts. A semiconductive channel region extends between the source contact and the drain contact. One or more pn junctions are defined between the source contact and the gate contact. The gate contact is located adjacent at least a portion of the channel region, and the conductivity of the channel region is altered by the presence of an electrical field. Thus, an electrical field is provided within the channel region by applying a voltage to the gate contact. Thus, for example, electrical current may flow through the transistor from the source contact to the drain contact through the channel region when a voltage is applied to the gate contact, but may not flow through the transistor from the source contact to the drain contact in the absence of an applied voltage to the gate contact.

Recently, field-effect transistors (FETs) have been developed that employ discrete, elongated channel structures referred to as "fins." Such a transistor is often referred to in the art as a "finFET." Many different configurations of finFETs have been proposed in the art.

The elongated channel structures or fins of a finFET comprise a semiconductor material that may be doped either n-type or p-type. It has also been demonstrated that the conductivity of n-type doped semiconductor materials may be improved when the n-type semiconductor material is in a state of tensile stress, and the conductivity of p-type semiconductor materials may be improved when the p-type semiconductor material is in a state of compressive stress.

FinFETs are currently used having cross-sectional dimensions below 22 nm. Such finFETs may employ fully depleted (undoped) channels that improve electrostatic performance of the transistors and avoid problems associated with random dopant fluctuations. It has been shown that introduction of tensile strain in the channel region of a transistor may improve the electron mobility of n-type FETs, and that the introduction of compressive strain in the channel region of a transistor may improve the hole mobility of p-type FETs.

BRIEF SUMMARY

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some embodiments, the present disclosure includes a method of fabricating a semiconductor structure. A multi-layer substrate is provided that includes a base substrate, a buried oxide layer over a surface of the base substrate, a strained primary semiconductor layer over the buried oxide layer on a side thereof opposite the base substrate, and an epitaxial base layer over the strained semiconductor layer on a side thereof opposite the buried oxide layer. Elements are diffused from the epitaxial base layer into the strained primary semiconductor layer within a first region of the multi-layer substrate without diffusing elements from the epitaxial base layer into the strained primary semiconductor layer within a second region of the multi-layer substrate, and a concentration of the diffused elements is enriched in the primary semiconductor layer within the first region such that a strain state in the primary semiconductor layer within the first region differs from a strain state in the primary semiconductor layer within the second region. A first plurality of transistor channel structures are formed that each comprise a portion of the primary semiconductor layer within the first region of the multi-layer substrate, and a second plurality of transistor channel structures are formed that each comprise a portion of the primary semiconductor layer within the second region of the multi-layer substrate.

In additional embodiments, the present disclosure includes a method of fabricating a semiconductor structure in which a multi-layer substrate is provided that includes a base substrate, a buried oxide layer over a surface of the base substrate, a strained primary semiconductor layer over the buried oxide layer on a side thereof opposite the base substrate, and an epitaxial base layer over the strained semiconductor layer on a side thereof opposite the buried oxide layer. A first region of the multi-layer substrate is masked with a first mask layer, and a portion of the epitaxial base layer is removed from a second region of the multi-layer substrate. The first mask layer is removed from the first region of the multi-layer substrate, and the second region of the multi-layer substrate is masked with a second mask layer. Elements are diffused from the epitaxial base layer into the strained primary semiconductor layer within the first region of the multi-layer substrate, and a strain state of the primary semiconductor layer within the first region of the multi-layer substrate is altered without diffusing elements into the strained primary semiconductor layer within the second region of the multi-layer substrate. A first plurality of transistor channel structures are formed that each comprise a portion of the primary semiconductor layer within the first region of the multi-layer substrate, and a second plurality of transistor channel structures are formed that each comprise a portion of the primary semiconductor layer within the second region of the multi-layer substrate.

In yet further embodiments, the present disclosure includes a semiconductor structure including a multi-layer substrate that comprises a base substrate, a buried oxide layer over a surface of the base substrate, and a primary semiconductor layer over the buried oxide layer on a side thereof opposite the base substrate. A portion of the primary semiconductor layer within a first region of the multi-layer substrate comprises $Si_yGe_{1-y}$, wherein y is between about 0.20 and about 0.99, and a portion of the primary semiconductor layer within a second region of the multi-layer substrate comprising tensile strained Si. The portion of the primary semiconductor layer within the first region of the multi-layer substrate has a crystallographic strain differing from a crystallographic strain of the portion of the primary semiconductor layer within the second region of the multi-layer substrate.

BRIEF DESCRIPTION OF THE DRAWINGS

While the specification concludes with claims particularly pointing out and distinctly claiming what are regarded as embodiments of the invention, the advantages of embodiments of the disclosure may be more readily ascertained from the description of certain examples of embodiments of the disclosure when read in conjunction with the accompanying drawings, in which:

FIG. 1 illustrates implantation of ions into a donor substrate that includes a bulk material, an epitaxial base layer, and a strained primary semiconductor layer, the implanted ions forming a zone of weakness within the epitaxial base layer;

FIG. 2 illustrates bonding of the donor substrate of FIG. 1 to a receiver substrate;

FIG. 3 illustrates separation of the donor substrate along the zone of weakness;

FIG. 4 illustrates a multi-layer substrate formed upon separation of the donor substrate along the zone of weakness as shown in FIG. 3;

DETAILED DESCRIPTION

The illustrations presented herein are not meant to be actual views of any particular semiconductor structure, device, system, or method, but are merely idealized representations that are used to describe embodiments of the disclosure.

Any headings used herein should not be considered to limit the scope of embodiments of the invention as defined by the claims below and their legal equivalents. Concepts described in any specific heading are generally applicable in other sections throughout the entire specification.

The terms "first" and "second" in the description and the claims are used for distinguishing between similar elements.

As used herein, the terms "fin" and "fin structure" mean an elongated, three-dimensional finite and bounded volume of semiconductor material having a length, a width, and a height, wherein the length is greater than the width. The width and height of the fin may vary along the length of the fin in some embodiments.

Methods that may be used to fabricate semiconductor devices are described below with reference to the figures. As discussed in further detail below, the methods generally involve providing a multi-layer substrate that includes a base substrate, a buried oxide (BOX) layer over a surface of the base substrate, a strained primary semiconductor layer over the BOX layer on a side thereof opposite the base substrate, and an epitaxial base layer over the strained semiconductor layer on a side thereof opposite the BOX layer. The epitaxial base layer may comprise a layer on which the primary semiconductor layer was previously epitaxially grown, as discussed herein below. After providing the multi-layer substrate, the multi-layer substrate may be processed in such a manner as to alter a strain state in one region of the primary semiconductor layer without altering a strain state in another region of the primary semiconductor layer, such that regions of different strain states exist in the primary semiconductor layer. N-type transistor structures then may be fabricated in a region or regions of the primary semiconductor layer that exhibit a strain state preferable for increased electron mobility, and p-type transistor structures may be fabricated in a region or regions of the primary semiconductor layer that exhibit a strain state preferable for increased hole mobility.

Figure 1:
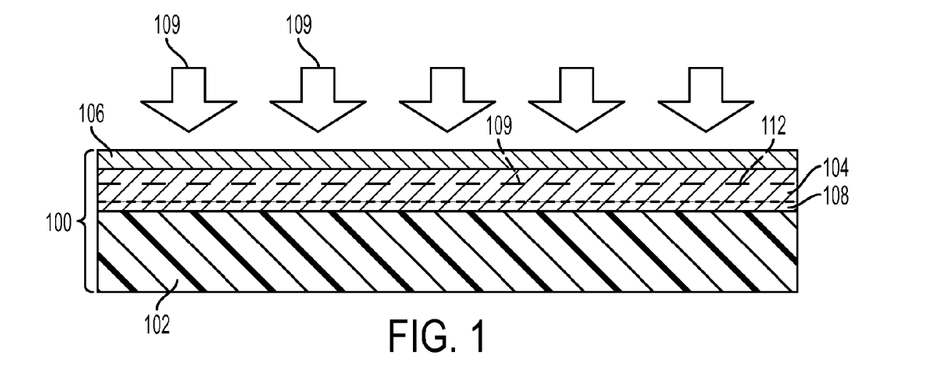
FIGS. 1 through 4 are simplified, schematically illustrated cross-sectional views illustrating fabrication of a multi-layer substrate that may be employed in accordance with embodiments of the present disclosure.

Example embodiments of methods that may be used to provide a multi-layer substrate are disclosed below with reference to FIGS. 1-4. FIG. 1 illustrates a donor substrate 100 that includes a bulk material 102, an epitaxial base layer 104 on the bulk material 102, and a strained semiconductor layer 106 on a side of the epitaxial base layer 104 opposite the bulk material 102.

The bulk material 102 may comprise a die or wafer of, for example, semiconductor material (e.g., silicon, silicon carbide, germanium, a III-V semiconductor material, etc.), a ceramic material (e.g., silicon oxide, aluminum oxide, silicon carbide, etc.), or a metal material (e.g., molybdenum, etc.). The bulk material 102 may have a monocrystalline or polycrystalline microstructure in some embodiments. In other embodiments, the bulk material 102 may be amorphous. The bulk material 102 may have a thickness ranging from, for example, about 400 µm to about 900 µm (e.g., about 750 µm).

The layers overlying the bulk material 102, such as the epitaxial base layer 104 and the primary semiconductor layer 106, may be deposited or "grown" over the substrate epitaxially using any of a number of different processes such as, for example, chemical vapor deposition (CVD), atomic layer deposition (ALD), physical vapor deposition (PLD), vapor phase epitaxy (VPE), and molecular beam epitaxy (MBE).

In some embodiments, the epitaxial base layer 104 may comprise a material that may be used to assist in retention of strain in the crystal lattice of the overlying primary semiconductor layer 106 in subsequent processing, as discussed in further detail below. Thus, the epitaxial base layer 104 may have a composition and/or layer thickness selected to allow the epitaxial base layer 104 to retain strain in the crystal lattice of the overlying primary semiconductor layer 106 in subsequent processing, as also discussed in further detail below.

The primary semiconductor layer 106 may comprise, for example, a layer of strained silicon (Si), strained germanium (Ge), strained silicon germanium (SiGe), or a strained III-V semiconductor material. Thus, the strained primary semiconductor layer 106 may have a crystal structure exhibiting lattice parameters that are either above (tensile strained) or below (compressively strained) the relaxed lattice parameters that would normally be exhibited by the crystal structure of the respective strained semiconductor layer 106 if the strained semiconductor layer 106 existed in free-standing, bulk form at equilibrium state. The primary semiconductor layer 106 may have an average layer thickness of about 50 nm or less, or even about 35 nm or less, although thicker layers of strained semiconductor material may also be employed in embodiments of the present disclosure.

Optionally, one or more buffer layers 108 may be provided between the bulk material 102 and the epitaxial base layer 104 to facilitate epitaxial growth of the epitaxial base layer 104 and the primary semiconductor layer 106 over the bulk material 102.

As a non-limiting specific example, the bulk material 102 of the donor substrate 100 may comprise a monocrystalline silicon substrate, the epitaxial base layer 104 may comprise $Si_xGe_{1-x}$ (wherein x is from about 0.01 to about 0.99, or, more specifically, from about 0.20 to about 0.80), and the primary semiconductor layer 106 may comprise strained silicon (sSi) or strained $Si_yGe_{1-y}$ (wherein y is from about 0.20 to about 0.99). In some embodiments, the $Si_xGe_{1-x}$ of the epitaxial base layer 104 may comprise at least substantially relaxed $Si_xGe_{1-x}$. In other words, the $Si_xGe_{1-x}$ of the epitaxial base layer 104 may be at least substantially free of crystallographic strain in some embodiments.

One or more buffer layers 108 comprising $Si_zGe_{1-z}$ (wherein the value of z gradually increases in a stepwise or continuous manner moving away from the bulk material 102) may be provided between the silicon of the bulk material 102 and the $Si_xGe_{1-x}$ epitaxial base layer 104.

The value of x in the $Si_xGe_{1-x}$ epitaxial base layer 104 may be selected so as to impart a desired level of strain in the overlying Si or $Si_yGe_{1-y}$ of the primary semiconductor layer 106. As known in the art, there is approximately a 4.2% lattice misfit between Si and Ge. Thus, the amount of Ge in the $Si_xGe_{1-x}$ epitaxial base layer 104 will at least partially determine the values of the lattice parameters in the $Si_xGe_{1-x}$ epitaxial base layer 104, and, hence, the amount of crystallographic strain in the crystal lattice of the Si or $Si_yGe_{1-y}$ of the overlying epitaxial primary semiconductor layer 106.

The epitaxial base layer 104 and the primary semiconductor layer 106 may have thicknesses below their respective critical thicknesses so as to avoid the onset relaxation and formation of localized defects in the crystal structure thereof.

After forming or otherwise providing the donor substrate 100 of FIG. 1, the primary semiconductor layer 106 and at least a portion of the epitaxial base layer 104 may be transferred to a receiver substrate 110 (FIG. 2) using, for example, what is referred to in the art as a SMARTCUT® process. The SMARTCUT® process is described in, for example, U.S. patent No. RE 39,484 to Bruel (issued Feb. 6, 2007), U.S. Pat. No. 6,303,468 to Aspar et al. (issued Oct. 16, 2001), U.S. Pat. No. 6,335,258 to Aspar et al. (issued Jan. 1, 2002), U.S. Pat. No. 6,756,286 to Moriceau et al. (issued Jun. 29, 2004), U.S. Pat. No. 6,809,044 to Aspar et al. (issued Oct. 26, 2004), and U.S. Pat. No. 6,946,365 to Aspar et al. (issued Sep. 20, 2005), the entire disclosures of which are incorporated herein in their entireties by this reference.

A plurality of ions (e.g., hydrogen, helium, or inert gas ions) may be implanted into the donor substrate 100. For example, ions may be implanted into the donor substrate 100 from an ion source positioned on a side of the donor substrate 100, as represented by the direction arrows 109 in FIG. 1. Ions may be implanted into the donor substrate 100 along a direction substantially perpendicular to the major surfaces of the donor substrate 100. As known in the art, the depth at which the ions are implanted into the donor substrate 100 is at least partially a function of the energy with which the ions are implanted into the donor substrate 100. Generally, ions implanted with less energy will be implanted at relatively shallower depths, while ions implanted with higher energy will be implanted at relatively deeper depths.

Ions may be implanted into the donor substrate 100 with a predetermined energy selected to implant the ions at a desirable depth within the donor substrate 100. As one particular non-limiting example, the ions may be disposed within the donor substrate 100 at a selected depth such that a zone of weakness is formed in the donor substrate 100. As known in the art, inevitably at least some ions may be implanted at depths other than the desired implantation depth, and a graph of the concentration of the ions as a function of depth into the donor substrate 100 from a surface of the donor substrate 100 may exhibit a generally bell shaped (symmetric or asymmetric) curve having a maximum at a desirable implantation depth.

Upon implantation into the donor substrate 100, the ions may define a zone of weakness 112 (illustrated as a dashed line in FIG. 1) within the donor substrate 100. The zone of weakness 112 may comprise a layer or region within the donor substrate 100 that is aligned with (e.g., centered about) the plane of maximum ion concentration with the donor substrate 100. The zone of weakness 112 may define a plane within the donor substrate 100 along which the donor substrate 100 may be cleaved or fractured in a subsequent process. As shown in FIG. 1, the zone of weakness 112 may be disposed within a substantially homogenous region of the donor substrate 100 comprising the epitaxial base layer 104.

Figure 2:
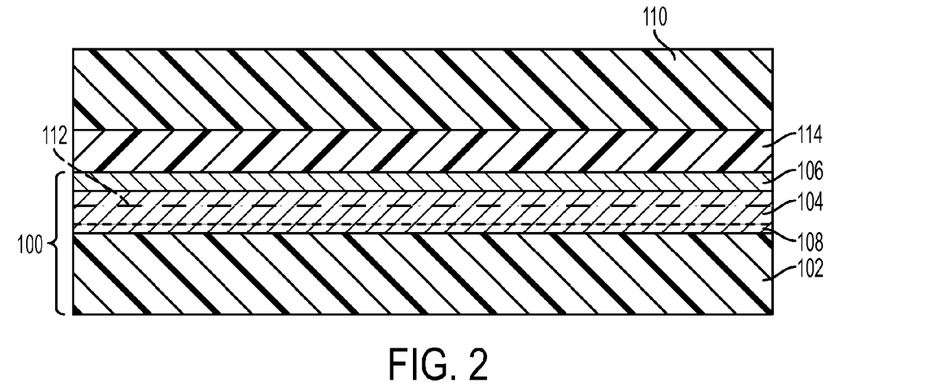

After forming the zone of weakness 112 within the donor substrate 100, the donor substrate 100 may be bonded to the receiver substrate 110 as shown in FIG. 2 using a direct molecular bonding process.

The direct molecular bonding process may form direct atomic bonds between the donor substrate 100 and the receiver substrate 110. The nature of the atomic bonds between the donor substrate 100 and the receiver substrate 110 will depend upon the material compositions at the surfaces of each of the donor substrate 100 and the receiver substrate 110.

In some embodiments, the direct bond between the bonding surface of the donor substrate 100 and the bonding surface of the receiver substrate 110 may be established by forming each of the bonding surface of the donor substrate 100 and the bonding surface of the receiver substrate 110 to have relatively smooth surfaces, and subsequently abutting the bonding surfaces together and initiating propagation of a bonding wave therebetween. For example, each of the bonding surface of the donor substrate 100 and the bonding surface of the receiver substrate 110 may be formed to have a root mean square surface roughness (RMS) of about two nanometers (2.0 nm) or less, about one nanometer (1.0 nm) or less, or even about one quarter of a nanometer (0.25 nm) or less. Each of the bonding surface of the donor substrate 100 and the bonding surface of the receiver substrate 110 may be smoothed using at least one of a mechanical polishing operation and a chemical etching operation. For example, a chemical mechanical planarization (CMP) operation may be used to planarize and/or reduce the surface roughness of each of the bonding surface of the donor substrate 100 and the bonding surface of the receiver substrate 110.

After smoothing the bonding surfaces, the bonding surfaces optionally may be cleaned and/or activated using processes known in the art. Such an activation process may be used to alter the surface chemistry at the bonding surfaces in a manner that facilitates the bonding process and/or results in the formation of a stronger bond.

The bonding surfaces may be brought into direct physical contact with one another, and pressure may be applied in a localized area across the bonding interface. Inter-atomic bonds may be initiated in the vicinity of the localized pressure area, and a bonding wave may propagate across the interface between the bonding surfaces.

Optionally, an annealing process may be used to strengthen the bond. Such an annealing process may comprise heating the bonded donor substrate 100 and receiver substrate 110 in a furnace at a temperature of between about one hundred degrees Celsius (100° C.) and about four hundred degrees Celsius (400° C.) for a time of between about two minutes (2 mins.) and about fifteen hours (15 hrs.).

An insulating layer 114 (such as, for example, an oxide (e.g., $SiO_2$, $Al_2O_3$, etc.), a nitride, or an oxynitride) may be provided on one or both of the donor substrate 100 and the receiver substrate 110 prior to the bonding process, such that the bonding surface of one or both of the donor substrate 100 and the receiver substrate 110 comprises a surface of the insulating layer 114. Thus, the direct molecular bonding process may comprise an oxide-to-oxide or oxide-to-silicon, or an oxide-to-SiGe direct molecular bonding process in such embodiments.

The insulating layer 114 may comprise what is often referred to in the art as a "Buried OXide layer" or "BOX." The insulating layer 114 may be crystalline or amorphous. The insulating layer 114 may have an average layer thickness in the bonded structure (which may include the thickness of both insulating layers 114 if deposited on both the donor substrate 100 and the receiver substrate 110 prior to bonding) of, for example, between about 10 nm and about 50 nm, although thicker or thinner insulating layers 114 may also be employed in embodiments of the present disclosure.

Figure 3:
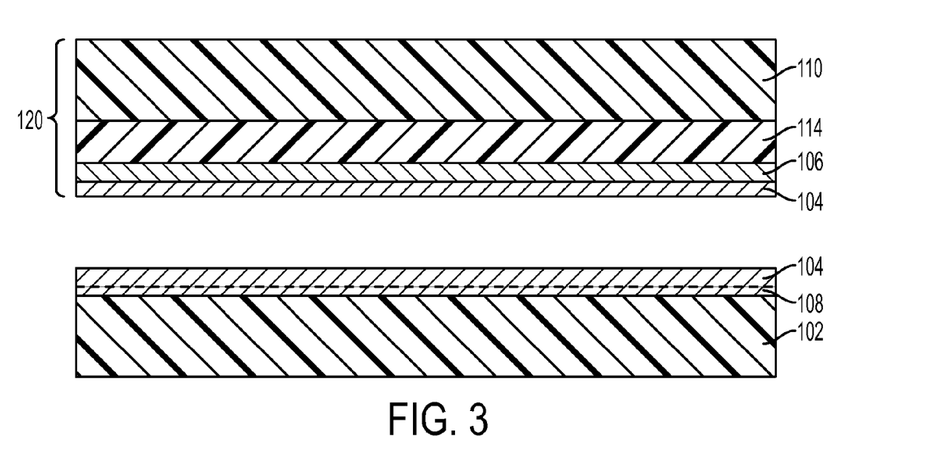

Referring to FIG. 3, after bonding the donor substrate 100 to the receiver substrate 110, the donor substrate 100 may be cleaved along the zone of weakness 112 (FIGS. 1 and 2). The donor substrate 100 may be cleaved or fractured along the zone of weakness 112 by heating the donor substrate 100 and/or applying a mechanical force to the donor substrate 100.

Upon fracturing the donor substrate 100 as shown in FIG. 3, a multi-layer substrate 120 is provided that includes the receiver substrate 110, which defines a base substrate of the multi-layer substrate 120, the insulating layer 114, which defines a buried oxide layer of the multi-layer substrate 120, the primary semiconductor layer 106 over the buried oxide layer 114 on a side thereof opposite the base substrate 110, and at least a portion of the epitaxial base layer 104 over the primary semiconductor layer 106 on a side thereof opposite the buried oxide layer 114.

Figure 4:
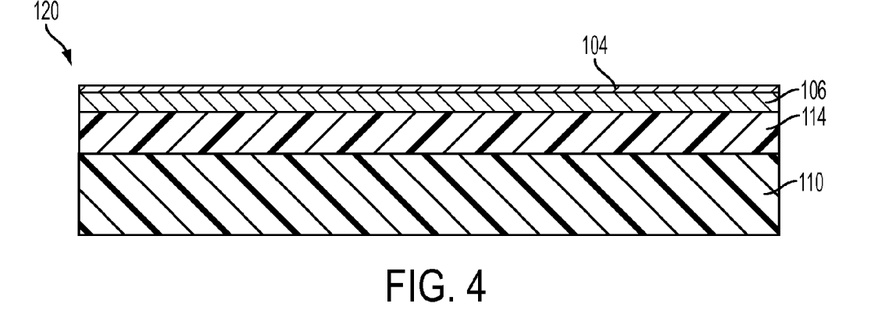

The multi-layer substrate 120 is shown in FIG. 3 inverted from the orientation shown in FIG. 4 for subsequent processing.

The thickness of the epitaxial base layer 104 of the multi-layer substrate 120 may be selectively controlled by controlling the location (i.e., depth) of the of the zone of weakness 112 within the donor substrate 100 (FIG. 1), and/or by selectively thinning the portion of the epitaxial base layer 104 of the multi-layer substrate 120 after fracturing the donor substrate 100 along the zone of weakness 112, as previously described with reference to FIG. 3. For example, in some embodiments, the thickness of the epitaxial base layer 104 may be selectively reduced using, for example, using at least one of a mechanical polishing operation and a chemical etching operation after fracturing the donor substrate 100 along the zone of weakness 112. For example, a chemical mechanical planarization (CMP) process may be used to reduce the thickness of the epitaxial base layer 104 to a predetermined and selected thickness after fracturing the donor substrate 100 along the zone of weakness 112. Such processing may also result in a reduction in surface roughness of the exposed major surface of the epitaxial base layer 104, and a more uniform thickness of the epitaxial base layer 104, which may also be desirable.

Figure 5:
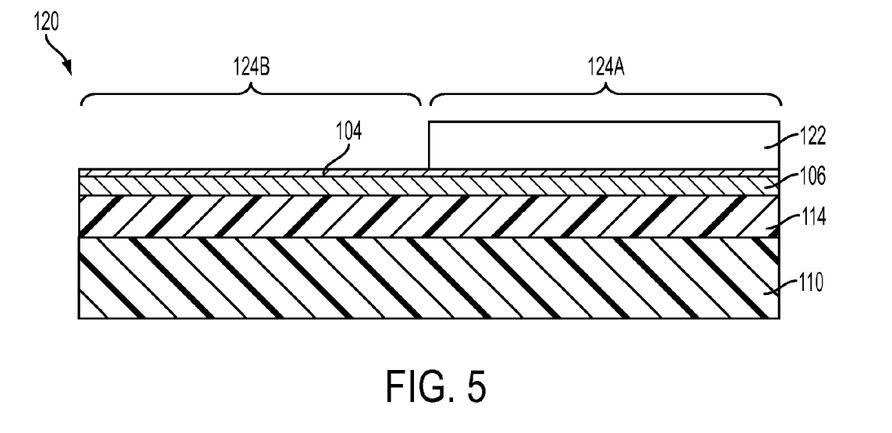
FIG. 5 illustrates a first mask layer covering a first region of the multi-layer substrate of FIG. 4, while another second region of the multi-layer substrate is uncovered and exposed through the first mask layer.

Referring to FIG. 5, a first mask layer 122 may be deposited or otherwise provided over the epitaxial base layer 104 and the primary semiconductor layer 106 within a first region 124A of the multi-layer substrate 120. The mask layer 122 may not cover the epitaxial base layer 104 and the primary semiconductor layer 106 within a second region 124B of the multi-layer substrate 120. The first mask layer 122 may be deposited at least substantially continuously over the multi-layer substrate 120, and then subsequently patterned to remove the mask layer 122 in the second region 124B of the multi-layer substrate 120, such that the epitaxial base layer 104 and the primary semiconductor layer 106 are exposed through the first mask layer 122 within the second region 124B of the multi-layer substrate 120.

The first mask layer 122 may comprise a single layer of mask material, or it may comprise a plurality of layers of mask material. The composition of the first mask layer 122 may be selected to be resistant to etching by an etchant used to subsequently etch and remove the mask layer 122 within the second region 124B of the multi-layer substrate 120, as discussed below. For example, the first mask layer 122 may comprise an oxide (e.g., $SiO_2$, $Al_2O_3$, etc.), a nitride (e.g., $Si_3N_4$), or an oxynitride (e.g., silicon oxynitride). As a non-limiting example, in embodiments in which the epitaxial base layer 104 comprises $Si_xGe_{1-x}$, and the primary semiconductor layer 106 comprises tensile strained silicon (sSi), the first mask layer 122 may comprise a multi-layer mask structure including a first layer of oxide (e.g., $SiO_2$), a layer of nitride (e.g., $Si_3N_4$) on a side of the first layer of oxide opposite the epitaxial base layer 104, and a second layer of oxide (e.g., $SiO_2$) on a side of the layer of nitride opposite the first layer of oxide, such that the nitride layer is sandwiched between the first and second oxide layers.

Figure 6:
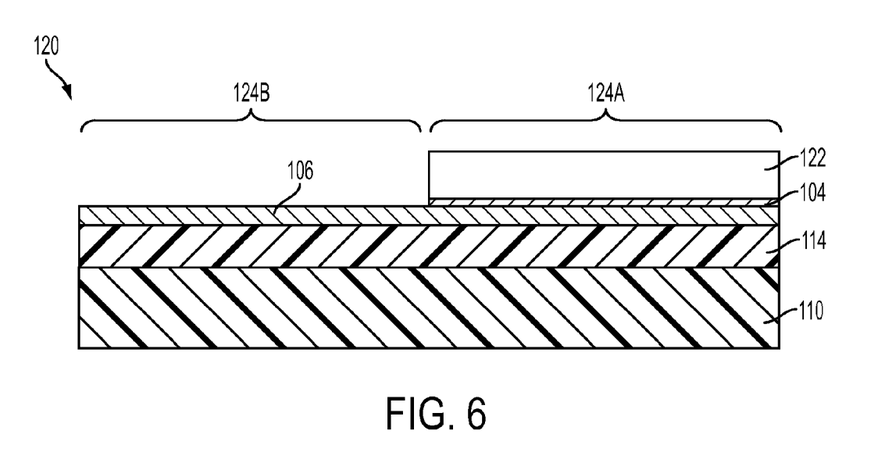
FIG. 6 illustrates the semiconductor structure of FIG. 5 after removing a portion of the epitaxial base layer from over the primary semiconductor layer in the second region of the multi-layer substrate, while another portion of the epitaxial base layer remains in place over the primary semiconductor layer under the first mask layer of FIG. 5 in the first region of the multi-layer substrate.

Referring to FIG. 6, after masking the epitaxial base layer 104 and the primary semiconductor layer 106 within the first region 124A of the multi-layer substrate 120 with the first mask layer 122, the exposed portion of the epitaxial base layer 104 may be removed from the second region 124B of the multi-layer substrate 120. An etching process may be used to remove the epitaxial base layer 104 from over the primary semiconductor layer 106 in the second region 124B.

The etching process used to remove the epitaxial base layer 104 from the primary semiconductor layer 106 in the second region 124B may comprise a wet etching process or a dry etching process (e.g., a reactive ion etching (RIE) process). The etching process may comprise an isotropic or anisotropic etching process. The etchant may be selected to etch the epitaxial base layer 104 selectively relative to the primary semiconductor layer 106, such that the epitaxial base layer 104 is preferentially removed by the etching process and the primary semiconductor layer 106 serves as an etch-stop layer. In other embodiments, the etching process may simply be terminated once the epitaxial base layer 104 has been removed, if an etchant is not available that will selectively remove the epitaxial base layer 104 without substantially removing the primary semiconductor layer 106.

As a non-limiting example, in embodiments in which the epitaxial base layer 104 comprises $Si_xGe_{1-x}$ and the primary semiconductor layer 106 comprises tensile strained silicon (sSi), a dry reactive ion etching (RIE) process may be used to remove the epitaxial base layer 104. Halogen-based chemistries including chlorine (e.g., $Cl_2$), fluorine (e.g., $CF_4$ or $SF_6$), and/or bromine (e.g., HBr) reactive gases may be used as the etchant in such dry RIE processes. The etch rate of the RIE etching process may be selectively controlled by adjusting gas ratios, pressure and bias power within the RIE etching chamber. See, for example, Marcelo S. B. Castro et al., "Selective and Anisotropic Dry Etching of Ge over Si," Journal of Integrated Circuits and Systems 2013, vol. 8, No. 2, pp. 104-109, which discloses such RIE etching processes and is incorporated herein in its entirety by this reference.

After removing the epitaxial base layer 104 from the underlying primary semiconductor layer 106 within the second region 124B of the multi-layer substrate 120, the mask layer 122 then may be removed from the multi-layer substrate 120.

Figure 7:
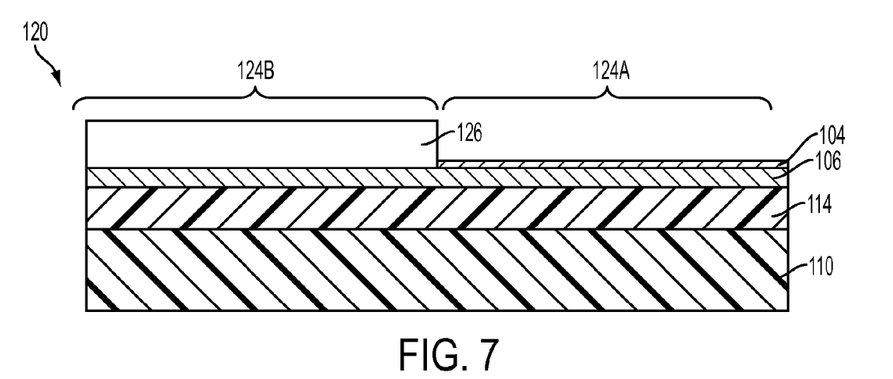
FIG. 7 illustrates a structure formed by removing the first mask layer from the first region of the multi-layer substrate and providing a second mask layer over the primary semiconductor layer in the second region of the multi-layer substrate.

Referring to FIG. 7, a second mask layer 126 may be deposited or otherwise formed over the exposed primary semiconductor layer 106 within the second region 124B of the multi-layer substrate 120. The second mask layer 126 may not cover the epitaxial base layer 104 and the primary semiconductor layer 106 within the first region 124A of the multi-layer substrate 120. The second mask layer 126 may be deposited at least substantially continuously over the multi-layer substrate 120, and then subsequently patterned to remove the mask layer 126 in the first region 124A of the multi-layer substrate 120, such that the epitaxial base layer 104 and the primary semiconductor layer 106 are exposed through the second mask layer 126 within the first region 124A of the multi-layer substrate 120.

The second mask layer 126 may comprise a single layer of mask material, or it may comprise a plurality of layers of mask material. The composition of the second mask layer 126 may be selected to be resistant to environmental conditions to which it may be exposed during an atomic diffusion process to be subsequently performed on the epitaxial base layer 104 and the primary semiconductor layer 106 within the first region 124A of the multi-layer substrate 120, as described below with reference to FIGS. 8A-8C. For example, the second mask layer 126 may comprise an oxide (e.g., $SiO_2$, $Al_2O_3$, etc.), a nitride (e.g., $Si_3N_4$), or an oxynitride (e.g., silicon oxynitride). As a non-limiting example, in embodiments in which the epitaxial base layer 104 comprises $Si_xGe_{1-x}$, and the primary semiconductor layer 106 comprises tensile strained silicon (sSi), the second mask layer 126 may comprise a multi-layer mask structure including a layer of oxide (e.g., $SiO_2$), and a layer of nitride (e.g., $Si_3N_4$) on a side of the layer of oxide opposite the epitaxial base layer 104.

After masking the primary semiconductor layer 106 within the second region 124B of the multi-layer substrate 120 with the second mask layer 126, a condensation process (often referred to as a "thermal mixing" process) or another type of process may be used to diffuse elements from the epitaxial base layer 104 within the first region 124A into the underlying primary semiconductor layer 106 so as to selectively reduce tensile strain and/or increase compressive strain in the primary semiconductor layer 106 within the first region 124A relative to the level of strain in the primary semiconductor layer 106 within the second region 124B of the multi-layer substrate 120. The presence of the second mask layer 126 and the absence of the epitaxial base layer 104 in the second region 124B may prevent diffusion of elements into the primary semiconductor layer 106 within the second region 124B, such that the strain in the primary semiconductor layer 106 is preserved during the condensation process carried out on the first region 124A of the multi-layer substrate 120. In other words, the condensation process may be carried out only on the first region 124A of the multi-layer substrate 120, and not on the second region 124B of the multi-layer substrate 120. Such a condensation process is described below with reference to FIGS. 8A-8C.

Figures 8A, 8B:
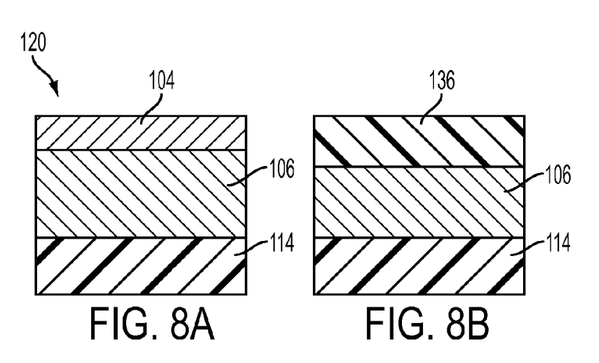
FIGS. 8A-8C are enlarged views of a portion of the first region of the multi-layer substrate, and illustrate a condensation process used to diffuse one or more elements from the epitaxial base layer into the primary semiconductor layer in the first region of the multi-layer substrate to alter a strain state within the primary semiconductor layer in the first region of the multi-layer substrate.

FIG. 8A is an enlarged view of a portion of the multi-layer substrate 120 shown in FIG. 6 within the first region 124A. The condensation process may involve subjecting the multi-layer substrate 120, with the primary semiconductor layer 106 masked within the second region 124B thereof, to an oxidation process in a furnace at elevated temperatures (e.g., between about 900° C. and about 1150° C.) in an oxidizing atmosphere (e.g., dry $O_2$). Referring to FIG. 8B, the oxidation process may result in the formation of an oxide layer 136 at the surface of the multi-layer substrate 120, and may cause diffusion of elements from the epitaxial base layer 104 into the primary semiconductor layer 106 within the first region 124A of the multi-layer substrate 120. With time, the boundary or interface between the epitaxial base layer 104 and the primary semiconductor layer 106 may become indiscrete, as the elements of the epitaxial base layer 104 become incorporated into the growing oxide layer 136 and/or diffuse into and become incorporated into the underlying primary semiconductor layer 106.

Figure 8C:
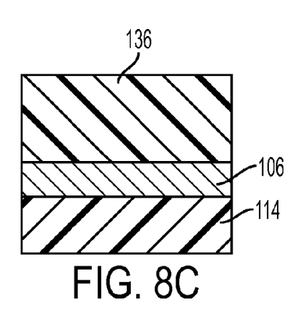

In embodiments in which the primary semiconductor layer 106 comprises tensile strained silicon (sSi), and the epitaxial base layer 104 comprises $Si_xGe_{1-x}$, the oxide layer 136 may comprise silicon dioxide ($SiO_2$) and the germanium of the $Si_xGe_{1-x}$ epitaxial base layer 104 may diffuse into the strained silicon (sSi) of the primary semiconductor layer 106, which transforms the sSi strained semiconductor layer 106 into a strained $Si_yGe_{1-y}$ primary semiconductor layer 106. The oxide layer 136 may form at the surface of the epitaxial base layer 104 and grow in thickness into the multi-layer substrate 120, through the dissolving epitaxial base layer 104 and into the primary semiconductor layer 106. As the thickness of the oxide layer 136 grows during the germanium condensation process, the thickness of the primary semiconductor layer 106 decreases and the concentration of germanium in the primary semiconductor layer 106 increases until a primary semiconductor layer 106 having a desired concentration of germanium in the strained $Si_yGe_{1-y}$ primary semiconductor layer 106 is attained, as shown in FIG. 8C. The diffusion of germanium into the primary semiconductor layer 106 may result in a decrease in any tensile strain within the primary semiconductor layer 106, and may lead to generation of compressive strain within the primary semiconductor layer 106. After the condensation process, the primary semiconductor layer 106 within the first region 124A may be in a state of tensile strain lower than a tensile strain in the primary semiconductor layer 106 within the second region 124B, the primary semiconductor layer 106 within the first region 124A may be in an at least substantially relaxed state free of tensile or compressive strain, or the primary semiconductor layer 106 within the first region 124A may be in a state of compressive strain.

The oxide layer 136 may optionally be removed from over the primary semiconductor layer 106 within the first region 124A of the multi-layer substrate 120 after performing the condensation process. The oxide layer 136 may be removed using, for example, a wet or dry etching process.

The condensation process may result in a decrease in the thickness of the primary semiconductor layer 106 within the first region 124A of the multi-layer substrate 120, as can be seen by comparing FIGS. 8A and 8C. In some embodiments, after performing the condensation process and removing the oxide layer 136, additional semiconductor material may be selectively epitaxially grown on the primary semiconductor layer 106 within the first region 124A of the multi-layer substrate 120 without epitaxially growing additional semiconductor material on the primary semiconductor layer 106 within the second region 124B of the multi-layer substrate 120. The additional semiconductor material may have the same composition and strain state as the underlying semiconductor material of the primary semiconductor layer 106 within the first region 124A of the multi-layer substrate 120. The selective epitaxial growth of additional semiconductor material may be used to thicken the primary semiconductor layer 106 within the first region 124A of the multi-layer substrate 120 such that a thickness of the primary semiconductor layer 106 within the first region 124A is at least substantially equal to a thickness of the primary semiconductor layer 106 within the second region 124B, which has not been subjected to the condensation process.

The condensation process may result in improved hole mobility within the primary semiconductor layer 106 within the first region 124A of the multi-layer substrate 120, which may be desirable for forming PMOS transistors, such as planar FET transistors or finFET transistors having transistor channel structures comprising regions of the primary semiconductor layer 106 within the first region 124A of the multi-layer substrate 120. The primary semiconductor layer 106 within the second region 124B of the multi-layer substrate 120 may remain in a state of tensile strain, which may be desirable for forming NMOS transistors, such as planar FET transistors or finFET transistors having transistor channel structures comprising regions of the primary semiconductor layer 106 within the second region 124B of the multi-layer substrate 120.

Figure 9:
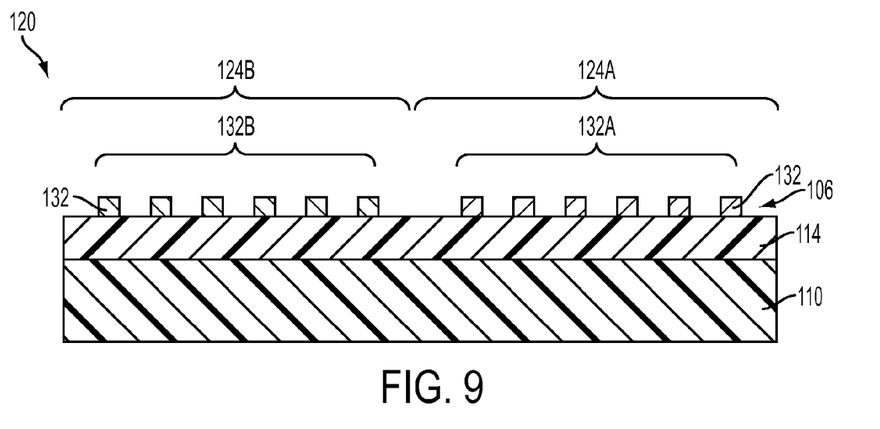
FIG. 9 illustrates a plurality of fin structures formed by etching through the primary semiconductor layer of the structure of FIG. 7.

Thus, referring to FIG. 9, after providing the multi-layer substrate 120, the multi-layer substrate 120 may be etched to define fin structures 132, each of which may comprise a portion of the primary semiconductor layer 106. Each of the fin structures 132 may be sized and configured for use in a finFET.

The etching process may be carried out by, for example, depositing a mask layer over the multi-layer substrate 120, patterning the mask layer to include openings therein at locations at which it is desired to etch into and through the epitaxial base layer 104 and the primary semiconductor layer 106, and then etching the primary semiconductor layer 106 through the patterned mask layer. Other processes known in the art for forming such fin structures 132 may be employed, such as spacer-defined double patterning (SDDP) processes, which are also referred to in the art as side-wall image transfer processes.

The etching process may comprise a wet etching process or a dry etching process (e.g., a reactive ion etching (RIE) process). The etching process may comprise an anisotropic etching process so as to provide fin structures 132 having generally vertical sidewalls. The etchant may be selected to etch the epitaxial base layer 104 and the primary semiconductor layer 106 selectively relative to the underlying BOX layer 114, such that the BOX layer 114 may serve as an etch-stop layer.

As a non-limiting example, in embodiments in which the primary semiconductor layer 106 comprises tensile strained silicon (sSi) within the second region 124B, and compressive strained $Si_yGe_{1-y}$ within the first region 124A, a dry reactive ion etching (RIE) process may be employed using halogen-based chemistries including chlorine (e.g., $Cl_2$), fluorine (e.g., $CF_4$ or $SF_6$), and/or bromine (e.g., HBr) reactive gases as an etchant.

The fin structures 132 may include a first plurality of fins 132A that are intended to be fins of p-type finFET transistors and a second plurality of fins 132B that are intended to be fins of n-type finFET transistors. Each of the first plurality of fins 132A may comprise a portion of the primary semiconductor layer 106 within the first region 124A of the multi-layer substrate 120, and each of the second plurality of fins 132B may comprise a portion of the primary semiconductor layer 106 within the second region 124B of the multi-layer substrate 120. As a result, the first plurality of fin structures 132A may be in a different strain state relative to the second plurality of fin structures 132B. In particular, the second plurality of fin structures 132B may be in a state of tensile strain, and the first plurality of fin structures 132A may be in a state of reduced tensile strain (relative to the second plurality of fin structures 132B), in a relaxed state at least substantially free of tensile or compressive strain, or in a state of compressive strain.

In some embodiments, the fin structures 132 may have one or more dimensions (e.g., length, width, or height) that is below a critical dimension at which the material of the fin structures 132 will relax either spontaneously or during subsequent processing at elevated temperatures. In some embodiments, the fin structures 132 may be formed to have an average fin width W (see FIG. 10) of about 30 nm or less, about 20 nm or less, or even about 15 nm or less.

In the methods described hereinabove, the epitaxial base layer 104 may be used as a base layer on which the primary semiconductor layer 106 is initially epitaxially grown such that the primary semiconductor layer 106 is in a strained state, as described with reference to FIG. 1, and may be used subsequently to alter a strain state of a portion of the primary semiconductor layer 106 in the condensation process, as described with reference to FIGS. 8A-8C.

As described hereinabove, the first plurality of fin structures 132A and the second plurality of fin structures 132B may be formed together in a common masking and etching process, as described with reference to FIG. 9.

The resulting structure formed by the methods described herein includes a first plurality of fin structures 132A and a second plurality of fin structures 132B disposed over the buried oxide layer 114 in a common plane on a side thereof opposite the base substrate 110. Each of the first plurality of fin structures 132A comprises a condensed primary semiconductor layer 106 including two or more elements (e.g., silicon and germanium). Each of the second plurality of fin structures 132B comprises a non-condensed primary semiconductor layer 106. Additionally, the fin structures 132 of the second plurality of fin structures 132B have a crystallographic strain differing from a crystallographic strain of the fin structures 132 of the first plurality of fin structures 132A. For example, the fin structures 132 of the second plurality of fin structures 132B may be in a state of tensile strain, and the fin structures 132 of the first plurality of fin structures 132A may be in a state of reduced tensile strain, a relaxed strain state (i.e., no strain), or a state of compressive strain.

After forming the first plurality of fin structures 132A and the second plurality of fin structures 132B as described hereinabove, a first plurality of PMOS finFET transistors may be formed comprising the first plurality of fin structures 132A, and a second plurality of NMOS finFET transistors may be formed comprising the second plurality of fin structures 132B.

Figure 10:
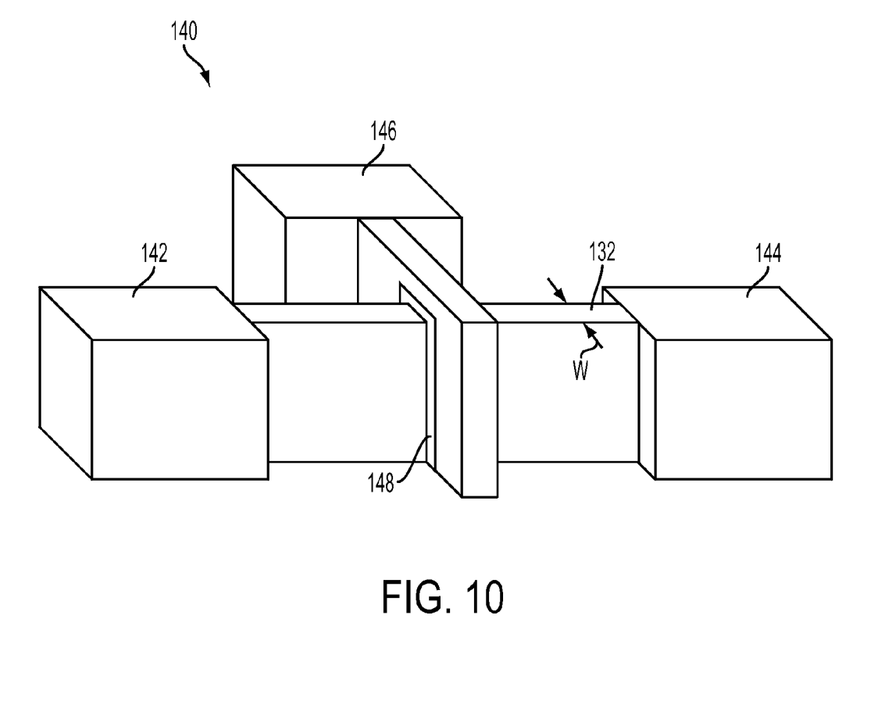
FIG. 10 illustrates an example structure of a finFET transistor.

FIG. 10 illustrates a non-limiting simplified example embodiment of a finFET transistor configuration that may be fabricated using the first plurality of fin structures 132A and/or the second plurality of fin structures 132B (see FIG. 9) in accordance with embodiments of the present disclosure. It should be noted that many different configurations of finFETs are known in the art and may be employed in accordance with embodiments of the disclosure, and the finFET structure shown in FIG. 10 is set forth merely as an example of such finFET structures.

As shown in FIG. 10, a finFET transistor 140 comprises a source region 142, a drain region 144, and a channel extending between the source region 142 and the drain region 144. The channel is defined by and comprises a fin 132, such as either a first fin structure 132A or a second fin structure 132B (see FIG. 9). In some embodiments, the source region 142 and the drain region 144 may include, or be defined by, longitudinal end portions of a fin structure 132. A conductive gate 146 extends over and adjacent at least a portion of the fin structure 132 between the source region 142 and the drain region 144. The gate 146 may be separated from the fin structure 132 by a dielectric material 148. The gate 146 may include a multi-layer structure, and may include semiconductive and/or conductive layers. A low-resistance layer including a metal, a metal compound or both, such as a conductive silicide, may be deposited over the source region 142 and/or the drain region 144 to form electrical contacts therewith.

Advantageously, tensile stress in the channel can increase the performance of NMOS finFET transistors and reduce the threshold voltage, while reduced tensile stress (e.g., less tensile stress, no tensile or compressive stress, or compressive stress) in the channel can increase the performance of PMOS finFET transistors and reduce the threshold voltage. For some functions, strained devices are beneficial because high performance is needed, and for some other functions, performance is not as important, but a high threshold voltage is beneficial. With embodiments of the present disclosure, the manufacturer can selectively incorporate differing levels of stress and strain into the crystal lattices of different finFET transistors in the same device in a common finFET transistor plane.

Although the methods and structures disclosed hereinabove are described in relation to finFET structures, it is noted that additional embodiments of the disclosure may involve the formation of conventional FET structures other than finFET structures, and a plurality of conventional p-type CMOS FET transistors may be fabricated using the primary semiconductor layer 106 within the first region 124A of the multi-layer substrate 120, and a plurality of conventional n-type CMOS FET transistors may be fabricated using the primary semiconductor layer 106 within the second region 124B of the multi-layer substrate 120.

Additional, non-limiting example embodiments of the disclosure are set forth below.

Embodiment 1

A method of fabricating a semiconductor structure, comprising: providing a multi-layer substrate, including: a base substrate, a buried oxide layer over a surface of the base substrate, a strained primary semiconductor layer over the buried oxide layer on a side thereof opposite the base substrate, and an epitaxial base layer over the strained semiconductor layer on a side thereof opposite the buried oxide layer; diffusing elements from the epitaxial base layer into the strained primary semiconductor layer within a first region of the multi-layer substrate without diffusing elements from the epitaxial base layer into the strained primary semiconductor layer within a second region of the multi-layer substrate and enriching a concentration of the diffused elements in the primary semiconductor layer within the first region such that a strain state in the primary semiconductor layer within the first region differs from a strain state in the primary semiconductor layer within the second region; and forming a first plurality of transistor channel structures each comprising a portion of the primary semiconductor layer within the first region of the multi-layer substrate and a second plurality of transistor channel structures each comprising a portion of the primary semiconductor layer within the second region of the multi-layer substrate.

Embodiment 2

The method of Embodiment 1, further comprising selecting the strained semiconductor layer to comprise strained silicon.

Embodiment 3

The method of Embodiment 2, further comprising selecting the strained semiconductor layer to comprise tensile strained silicon.

Embodiment 4

The method of any one of Embodiments 1 through 3, further comprising selecting the epitaxial base layer to comprise $Si_xGe_{1-x}$, wherein x is from about 0.01 to about 0.99, and wherein diffusing elements from the epitaxial base layer into the strained primary semiconductor layer comprises diffusing germanium into the strained primary semiconductor layer within the first region of the multi-layer substrate.

Embodiment 5

The method of any one of Embodiments 1 through 4, wherein forming a first plurality of transistor channel structures and forming the second plurality of transistor channel structures comprises etching through the primary semiconductor layer and defining fin structures, each of the fin structures comprising a portion of the primary semiconductor layer, each of the fin structures being sized and configured for use in a FinFET.

Embodiment 6

The method of any one of Embodiments 1 through 5, wherein providing the multi-layer substrate comprises: epitaxially growing the strained semiconductor layer on the epitaxial base layer over a donor substrate to form a donor structure; implanting ions into the donor structure and forming a zone of weakness within the donor structure; bonding the donor structure to a receiver substrate comprising the base substrate; and cleaving the donor structure along the zone of weakness to transfer the strained semiconductor layer and the epitaxial base layer to the base substrate.

Embodiment 7

The method of Embodiment 6, wherein bonding the donor structure to the receiver substrate comprises providing an oxide layer on one or both of the donor structure and the receiver substrate, and bonding the donor structure to the receiver substrate using a direct bonding process.

Embodiment 8

The method of Embodiment 6 or Embodiment 7, further comprising disposing the zone of weakness within a substantially homogenous region of the donor substrate comprising the epitaxial base layer.

Embodiment 9

The method of any one of Embodiments 1 through 8, wherein diffusing elements from the epitaxial base layer into the strained primary semiconductor layer within the first region of the multi-layer substrate comprises relaxing strain in the primary semiconductor layer within the first region of the multi-layer substrate.

Embodiment 10

The method of any one of Embodiments 1 through 9, wherein diffusing elements from the epitaxial base layer into the strained primary semiconductor layer within the first region of the multi-layer substrate comprises inducing compressive strain in the primary semiconductor layer within the first region of the multi-layer substrate.

Embodiment 11

The method of any one of Embodiments 1 through 10, wherein diffusing elements from the epitaxial base layer into the strained primary semiconductor layer within the first region of the multi-layer substrate comprises increasing a hole mobility within the primary semiconductor layer within the first region.

Embodiment 12

The method of any one of Embodiments 1 through 11, wherein diffusing elements from the epitaxial base layer into the strained primary semiconductor layer within the first region of the multi-layer substrate comprises carrying out a condensation process on the primary semiconductor layer within the first region of the multi-layer substrate.

Embodiment 13

The method of Embodiment 12, wherein carrying out a condensation process on the primary semiconductor layer within the first region of the multi-layer substrate comprises oxidizing a portion of the primary semiconductor layer within the first region of the multi-layer substrate.

Embodiment 14

The method of any one of Embodiments 1 through 13, further comprising forming a plurality of p-type FET transistors comprising the first plurality of transistor channel structures and forming a plurality of n-type FET transistors comprising the second plurality of transistor channel structures.

Embodiment 15

A method of fabricating a semiconductor structure, comprising: providing a multi-layer substrate, including: a base substrate, a buried oxide layer over a surface of the base substrate, a strained primary semiconductor layer over the buried oxide layer on a side thereof opposite the base substrate, and an epitaxial base layer over the strained semiconductor layer on a side thereof opposite the buried oxide layer; masking a first region of the multi-layer substrate with a first mask layer and removing a portion of the epitaxial base layer from a second region of the multi-layer substrate; removing the first mask layer from the first region of the multi-layer substrate and masking the second region of the multi-layer substrate with a second mask layer; diffusing elements from the epitaxial base layer into the strained primary semiconductor layer within the first region of the multi-layer substrate and altering a strain state of the primary semiconductor layer within the first region of the multi-layer substrate without diffusing elements into the strained primary semiconductor layer within the second region of the multi-layer substrate; and forming a first plurality of transistor channel structures each comprising a portion of the primary semiconductor layer within the first region of the multi-layer substrate and a second plurality of transistor channel structures each comprising a portion of the primary semiconductor layer within the second region of the multi-layer substrate.

Embodiment 16

The method of Embodiment 15, further comprising selecting the strained semiconductor layer to comprise tensile strained silicon.

Embodiment 17

The method of Embodiment 15 or Embodiment 16, further comprising selecting the epitaxial base layer to comprise at least substantially relaxed $Si_xGe_{1-x}$, wherein x is from about 0.01 to about 0.99, and wherein diffusing elements from the epitaxial base layer into the strained primary semiconductor layer within the first region of the multi-layer substrate comprises diffusing germanium into the strained primary semiconductor layer within the first region of the multi-layer substrate.

Embodiment 18

The method of any one of Embodiments 15 through 17, further comprising forming a plurality of p-type FET transistors comprising the first plurality of transistor channel structures and forming a plurality of n-type FET transistors comprising the second plurality of transistor channel structures.

Embodiment 19

A semiconductor structure including a multi-layer substrate, comprising: a base substrate, a buried oxide layer over a surface of the base substrate, and a primary semiconductor layer over the buried oxide layer on a side thereof opposite the base substrate, a portion of the primary semiconductor layer within a first region of the multi-layer substrate comprising $Si_yGe_{1-y}$, wherein y is between about 0.20 and about 0.99, a portion of the primary semiconductor layer within a second region of the multi-layer substrate comprising tensile strained Si; wherein the portion of the primary semiconductor layer within the first region of the multi-layer substrate has a crystallographic strain differing from a crystallographic strain of the portion of the primary semiconductor layer within the second region of the multi-layer substrate.

Embodiment 20

The semiconductor structure of Embodiment 19, further comprising a first plurality of p-type FET transistors each comprising a portion of the primary semiconductor layer within the first region of the multi-layer substrate, and a second plurality of n-type FET transistors each comprising a portion of the primary semiconductor layer within the second region of the multi-layer substrate.

The example embodiments of the disclosure described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the disclosure, in addition to those shown and described herein, such as alternative useful combinations of the elements described, will become apparent to those skilled in the art from the description. In other words, one or more features of one example embodiment described herein may be combined with one or more features of another example embodiment described herein to provide additional embodiments of the disclosure. Such modifications and embodiments are also intended to fall within the scope of the appended claims.

What is claimed is:

1. A method of fabricating a semiconductor structure, comprising:
   providing a multi-layer substrate, including:
     a base substrate,
     a buried oxide layer over a surface of the base substrate,
     a strained primary semiconductor layer over the buried oxide layer on a side thereof opposite the base substrate, and
     an epitaxial base layer over the strained semiconductor layer on a side thereof opposite the buried oxide layer;
   diffusing elements from the epitaxial base layer into the strained primary semiconductor layer within a first region of the multi-layer substrate without diffusing elements from the epitaxial base layer into the strained primary semiconductor layer within a second region of the multi-layer substrate and enriching a concentration of the diffused elements in the primary semiconductor layer within the first region such that a strain state in the primary semiconductor layer within the first region differs from a strain state in the primary semiconductor layer within the second region; and
   forming a first plurality of transistor channel structures each comprising a portion of the primary semiconductor layer within the first region of the multi-layer substrate and a second plurality of transistor channel structures each comprising a portion of the primary semiconductor layer within the second region of the multi-layer substrate.

2. The method of claim 1, further comprising selecting the strained semiconductor layer to comprise strained silicon.

3. The method of claim 2, further comprising selecting the strained semiconductor layer to comprise tensile strained silicon.

4. The method of claim 2, further comprising selecting the epitaxial base layer to comprise $Si_xGe_{1-x}$, wherein x is from about 0.01 to about 0.99, and wherein diffusing elements from the epitaxial base layer into the strained primary semiconductor layer comprises diffusing germanium into the strained primary semiconductor layer within the first region of the multi-layer substrate.

5. The method of claim 1, wherein forming a first plurality of transistor channel structures and forming the second plurality of transistor channel structures comprises etching through the primary semiconductor layer and defining fin structures, each of the fin structures comprising a portion of the primary semiconductor layer, each of the fin structures being sized and configured for use in a FinFET.

6. The method of claim 1, wherein providing the multi-layer substrate comprises:
   epitaxially growing the strained semiconductor layer on the epitaxial base layer over a donor substrate to form a donor structure;
   implanting ions into the donor structure and forming a zone of weakness within the donor structure;
   bonding the donor structure to a receiver substrate comprising the base substrate; and
   cleaving the donor structure along the zone of weakness to transfer the strained semiconductor layer and the epitaxial base layer to the base substrate.

7. The method of claim 6, wherein bonding the donor structure to the receiver substrate comprises providing an oxide layer on one or both of the donor structure and the receiver substrate, and bonding the donor structure to the receiver substrate using a direct bonding process.

8. The method of claim 6, further comprising disposing the zone of weakness within a substantially homogenous region of the donor substrate comprising the epitaxial base layer.

9. The method of claim 1, wherein diffusing elements from the epitaxial base layer into the strained primary semiconductor layer within the first region of the multi-layer substrate comprises relaxing strain in the primary semiconductor layer within the first region of the multi-layer substrate.

10. The method of claim 1, wherein diffusing elements from the epitaxial base layer into the strained primary semiconductor layer within the first region of the multi-layer substrate comprises inducing compressive strain in the primary semiconductor layer within the first region of the multi-layer substrate.

11. The method of claim 1, wherein diffusing elements from the epitaxial base layer into the strained primary semiconductor layer within the first region of the multi-layer substrate comprises increasing a hole mobility within the primary semiconductor layer within the first region.

12. The method of claim 1, wherein diffusing elements from the epitaxial base layer into the strained primary semiconductor layer within the first region of the multi-layer substrate comprises carrying out a condensation process on the primary semiconductor layer within the first region of the multi-layer substrate.

13. The method of claim 12, wherein carrying out a condensation process on the primary semiconductor layer within the first region of the multi-layer substrate comprises oxidizing a portion of the primary semiconductor layer within the first region of the multi-layer substrate.

14. The method of claim 1, further comprising forming a plurality of p-type FET transistors comprising the first plurality of transistor channel structures and forming a plurality of n-type FET transistors comprising the second plurality of transistor channel structures.

15. A method of fabricating a semiconductor structure, comprising:
   providing a multi-layer substrate, including:
     a base substrate,
     a buried oxide layer over a surface of the base substrate,
     a strained primary semiconductor layer over the buried oxide layer on a side thereof opposite the base substrate, and
     an epitaxial base layer over the strained semiconductor layer on a side thereof opposite the buried oxide layer;

masking a first region of the multi-layer substrate with a first mask layer and removing a portion of the epitaxial base layer from a second region of the multi-layer substrate;

removing the first mask layer from the first region of the multi-layer substrate and masking the second region of the multi-layer substrate with a second mask layer;

diffusing elements from the epitaxial base layer into the strained primary semiconductor layer within the first region of the multi-layer substrate and altering a strain state of the primary semiconductor layer within the first region of the multi-layer substrate without diffusing elements into the strained primary semiconductor layer within the second region of the multi-layer substrate; and forming a first plurality of transistor channel structures each comprising a portion of the primary semiconductor layer within the first region of the multi-layer substrate and a second plurality of transistor channel structures each comprising a portion of the primary semiconductor layer within the second region of the multi-layer substrate.

16. The method of claim 15, further comprising selecting the strained semiconductor layer to comprise tensile strained silicon.

17. The method of claim 16, further comprising selecting the epitaxial base layer to comprise at least substantially relaxed $Si_xGe_{1-x}$, wherein x is from about 0.01 to about 0.99, and wherein diffusing elements from the epitaxial base layer into the strained primary semiconductor layer within the first region of the multi-layer substrate comprises diffusing germanium into the strained primary semiconductor layer within the first region of the multi-layer substrate.

18. The method of claim 17, further comprising forming a plurality of p-type FET transistors comprising the first plurality of transistor channel structures and forming a plurality of n-type FET transistors comprising the second plurality of transistor channel structures.

* * * * *